(12) United States Patent
Mui

(10) Patent No.: US 7,391,342 B1
(45) Date of Patent: Jun. 24, 2008

(54) LOW-COST KEYPAD ENCODING CIRCUIT

(75) Inventor: Daniel SauFu Mui, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 636 days.

(21) Appl. No.: 10/359,405

(22) Filed: Feb. 5, 2003

(51) Int. Cl.
*H03M 11/00* (2006.01)

(52) U.S. Cl. .................... 341/22; 361/735; 361/766; 438/700; 438/702

(58) Field of Classification Search ............ 341/20, 341/22; 438/700, 702; 361/778, 750, 751, 361/765, 766
See application file for complete search history.

(56) References Cited

U.S. PATENT DOCUMENTS

| | | | | |
|---|---|---|---|---|
| 4,015,254 A | * | 3/1977 | Strandt .................. | 341/22 |
| 4,479,890 A | * | 10/1984 | Prabhu et al. ............ | 427/98.4 |
| 5,148,355 A | * | 9/1992 | Lowe et al. .............. | 361/778 |
| 5,291,179 A | * | 3/1994 | Ooe et al. ................ | 338/307 |
| 5,619,196 A | * | 4/1997 | Escobosa ................ | 341/22 |
| 6,184,805 B1 | * | 2/2001 | Uggmark ................ | 341/29 |
| 6,222,466 B1 | * | 4/2001 | Uggmark ................ | 341/22 |
| 6,399,230 B1 | * | 6/2002 | Tormey et al. ............ | 428/702 |
| 6,440,318 B1 | * | 8/2002 | Lee et al. ................ | 216/13 |
| 6,504,492 B1 | * | 1/2003 | Muurinen ................ | 341/22 |
| 6,597,277 B2 | * | 7/2003 | Hellriegel ................ | 338/310 |
| 6,713,399 B1 | * | 3/2004 | Kao ........................ | 438/700 |
| 6,737,990 B1 | * | 5/2004 | Chau ...................... | 341/22 |

OTHER PUBLICATIONS

Wikipedia reference pertaining to analog-to-digital converter. Nov. 7, 2002 revision.*

* cited by examiner

*Primary Examiner*—Albert K Wong
(74) *Attorney, Agent, or Firm*—Imperium Patent Works; Darien K. Wallace; T. Lester Wallace

(57) ABSTRACT

A keypad encoding circuit contains a voltage dividing network and an integrated circuit. The voltage dividing network includes a string of resistors that generates an encoding signal voltage. The integrated circuit converts the encoding signal voltage into a digital value indicative of which of the keys has been pressed. The cost of the voltage dividing network is reduced by forming the resistors from a layer of conductive carbon and avoiding the cost of providing discrete resistors. Each resistor has the same resistance even where the dimensions of the conductive carbon patches that form the resistors vary. Providing the resistors does not involve additional manufacturing cost because the resistors are made in the same step as are the landing pads of the voltage dividing circuit. Manufacturing costs associated with etched printed circuit board layers are avoided because inexpensive printed layers are used to realize the required traces and resistors.

25 Claims, 7 Drawing Sheets

LOW-COST KEYPAD ENCODING CIRCUIT

TECHNICAL FIELD

The present invention relates to keypad encoding circuits, and more specifically to low-cost circuits that determine which key is pressed on a remote control device of an electronic appliance.

BACKGROUND

Various circuits exist for determining which key is pressed on a keypad of a remote control device. One older circuit includes a voltage dividing network of resistors and an integrated circuit with an analog-to-digital converter (ADC). When a key on the keypad is pressed, a node in the voltage dividing network is connected to a ground lead such that the voltage dividing network outputs an encoding signal voltage that is unique for the specific key that is pressed. The voltage dividing network contains a string of discrete series-connected resistors. The ADC receives the encoding signal voltage and converts it into a digital value that corresponds to the pressed key. U.S. Pat. No. 4,015,254 describes a keyboard encoding circuit with a voltage dividing network.

Some keypad encoding applications are extremely cost sensitive. Each discrete component (for example, a discrete surface mount resistor) adds cost to the circuit. Keypad encoding circuits have been developed that achieve substantial cost savings by reducing the use of discrete components.

FIG. 1 (prior art) is a schematic diagram of one such circuit, called a keypad matrix scanning circuit 10. The keys (0-9, and POWER) of a keypad are arranged in a matrix. Vertical conductors connect keys oriented in columns, and horizontal conductors connect keys along rows. A landing pad is disposed at each location where a vertical conductor and horizontal conductor cross. For example, landing pad 11 is disposed at the intersection of a row conductor and a column conductor at the five key. When a key located at an intersection is pressed, a conductive portion of the key makes contact with both sides of the landing pad thereby coupling the vertical and horizontal conductors together. An integrated circuit 12 periodically scans all keys in the matrix by successively transmitting a digital code on each of the conductors in one dimension and then detecting which of the conductors in the other dimension returns the code.

To determine that a key has been pressed, for example the five key, integrated circuit 12 successively transmits an encoding signal voltage, such as a digital one, on each of its row terminals A, B, C and D. Integrated circuit 12 detects a digital one on a column terminal only at the instant when a digital one is transmitted from output terminal C. This digital one is detected only on column terminal F. The keypad encoding circuit 10 determines that the five key has been pressed because row terminal C and column terminal F can be coupled only by the five key.

In keypad matrix scanning circuit 10, integrated circuit 12 has a separate terminal for each row and column of the keypad matrix. Integrated circuit 12 has four row terminals A, B, C and D, three column terminals E, F, and G, one $V_{CC}$ power terminal and one ground terminal. This large number of terminals results in the package of the integrated circuit being more expensive due to having to provide a large number of terminals (i.e., pins) on the package.

Cost is a major consideration in the business of infrared transmitting remote control devices for electronic appliances. It is not uncommon for a remote control device to have more than thirty-six keys, for example. To scan thirty-six keys, an integrated circuit package having at least twelve terminals would be required. Each of these terminals adds substantial cost. A large number of terminals also often results in the integrated circuit die contained in the package being more expensive due to having to provide a large number of bonding pads and associated bond wires.

The cost of a remote control device can be reduced not only by reducing the number of discrete components in the keypad encoding circuit and the number of integrated circuit terminals, but also by reducing the number of layers on the printed circuit board upon which the keyboard matrix scanning circuitry is disposed. The horizontal and vertical conductors of the scanning circuitry can, for example, be realized on a two-sided printed circuit board having an etched conductive layer of traces on each side. The horizontal conductors may, for example, be traces disposed on one side of the printed circuit board whereas the vertical conductors are traces disposed on the other side. Metal landing pads are placed at the intersection of the column and row traces. To prevent the metal landing pads on the printed circuit board from oxidizing, becoming more resistive, and compromising operation of the keypad, the metal of the landing pads is covered with a conductive carbon layer. The conductive carbon layer is deposited using an inexpensive silk screen process. Providing each of the two layers of traces and the conductive carbon layer in this printed circuit board, however, involves cost.

A lower-cost keypad encoding circuit therefore involves a single-sided printed circuit board. The conductors in one dimension are formed as conventional etched metal traces (for example, copper traces) on the printed circuit board. A solder mask is then disposed over the copper traces. The conductors in the other dimension are then formed as traces of conductive carbon on top of the solder mask using a silk screen mask. Because these conductive carbon traces are formed of the same layer that is used to protect the landing pads from oxidation, providing the second layer of traces does not involve the additional cost associated with providing a second layer of etched traces in a conventional two-sided printed circuit board.

Although the cost of providing keypad encoding circuitry on a remote control device has been reduced considerably, additional cost savings are desired. In the specific business of television remote control devices, the cost savings achieved by eliminating even one discrete resistor, one integrated circuit terminal or one printed circuit board layer is significant. A less expensive keypad encoding circuit is sought.

SUMMARY

A keypad encoding circuit contains a voltage dividing network that generates an encoding signal voltage indicative of which of a plurality of keys on a keypad has been pressed. An analog-to-digital converter disposed on an integrated circuit receives the encoding signal voltage and converts it into a digital value indicative of which key has been pressed.

In some embodiments, the voltage dividing network includes a resistor string involving a plurality of resistors and a corresponding plurality of intervening nodes. The keys are part of a single flexible non-conductive member such as, for example, a rubber pad. When a key of the rubber pad is pressed, a node associated with the key is shorted through a conductive backing on the key to ground, thereby effectively shortening the length of the resistor string. By shortening the length of the resistor string, the encoding signal voltage that is indicative of which key has been pressed is generated.

The cost of providing the resistor string is reduced by using patches of a non-oxidizing conductive layer (for example, conductive carbon) to form the individual resistors on a printed circuit board. Costs associated with having to provide discrete resistor components (for example, surface mount components) and solder them to the printed circuit board are therefore avoided. Providing the conductive carbon resistors does not introduce additional manufacturing cost in one embodiment, because the same conductive carbon layer that is used to realize landing pads of the voltage dividing network is also used to realize the resistors of the resistor string.

Only one terminal is required on the integrated circuit to receive the encoding signal voltage. Costs associated with having to provide multiple terminals on the integrated circuit package for key scanning purposes are therefore avoided.

In some embodiments, printed circuit board fabrication costs associated with making etched layers of traces are avoided because only two relatively inexpensive sets of printed traces (for example, silk-screened traces) are used on the printed circuit board to realize the voltage dividing network. One of these sets of traces may be formed from a silk-screened layer containing a metal such as silver. The other of these sets of traces may be formed from a silk-screened layer of a relatively more resistive layer of conductive carbon. In one embodiment, the traces of these two sets of traces are fashioned so that no two traces cross one another. Because no two traces cross one another, an insulating layer is not required to insulate one trace from another. In accordance with one embodiment, manufacturing cost is reduced by not including such an insulating layer.

By reducing the number of terminals on the integrated circuit as set forth above, the spacing between terminals on the integrated circuit can be increased. In accordance with one embodiment, terminal spacing is increased such that a solder mask is not required. By not providing a solder mask layer on the printed circuit board, manufacturing cost is still further reduced.

Although the encoding signal voltage is indicative of which key has been pressed, the identity of the pressed key can be most easily deciphered when each resistor of the resistor string has the same resistance. In one embodiment, the voltage dividing network includes a resistor string involving a plurality of conductive carbon patches, whose dimensions and alignment vary. It is nevertheless desired that each conductive carbon patch exhibit substantially the same resistance.

In accordance with one embodiment, the ends of collinear traces have T-shaped ends over which conductive carbon patches are disposed. The resistance of each conductive carbon patch depends on the distance between the traces whose T-shaped ends are connected by the conductive carbon patches. By maintaining similar distances, similar resistances can be achieved, even though the dimensions and alignment of the conductive carbon patches may vary.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 2:
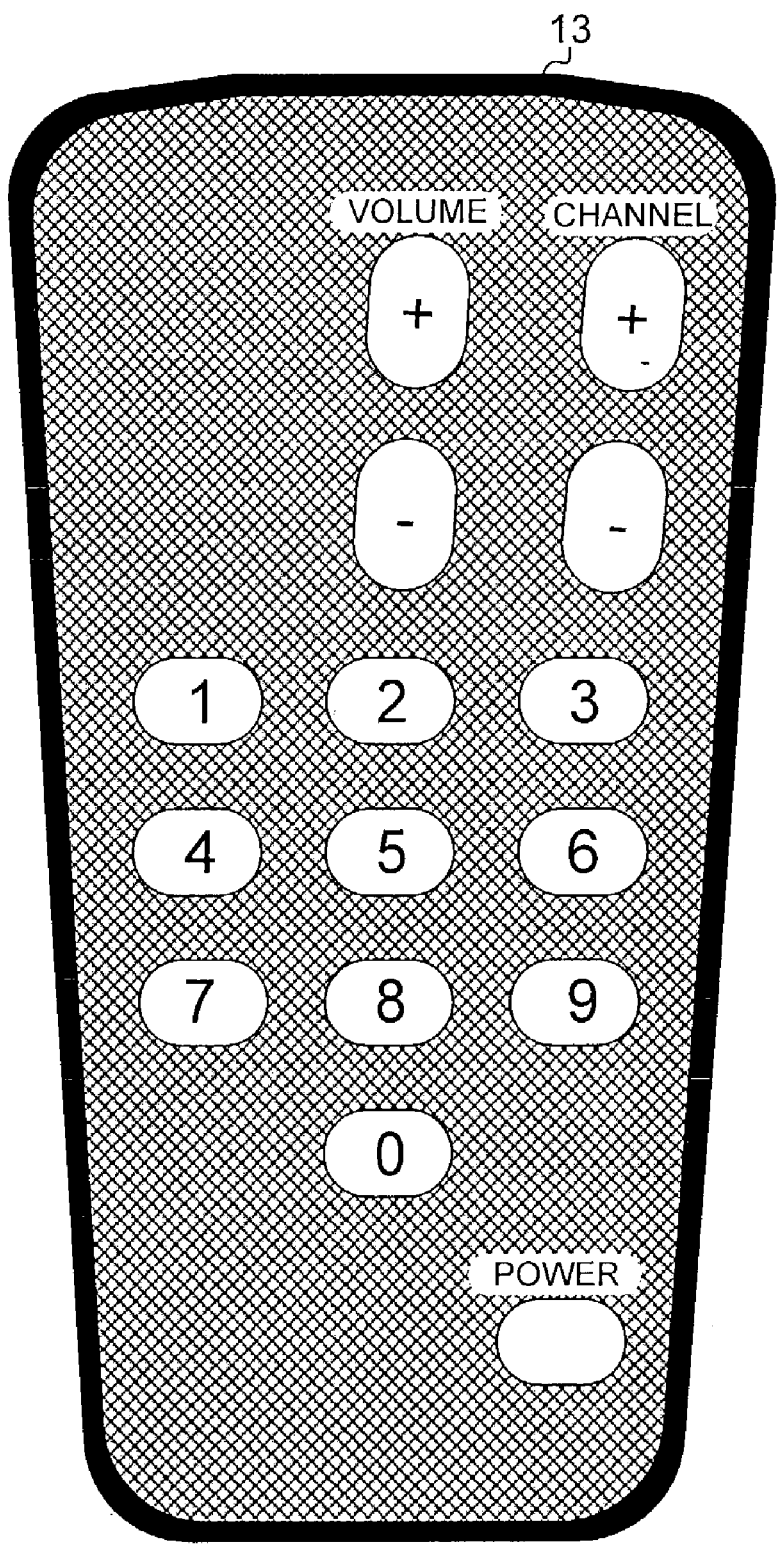
FIG. 2 is a top-down diagram of a remote control device in accordance with an embodiment of the present invention.

FIG. 2 is a top-down view of a basic remote control device 13 having a keypad with fifteen keys.

Figure 3:
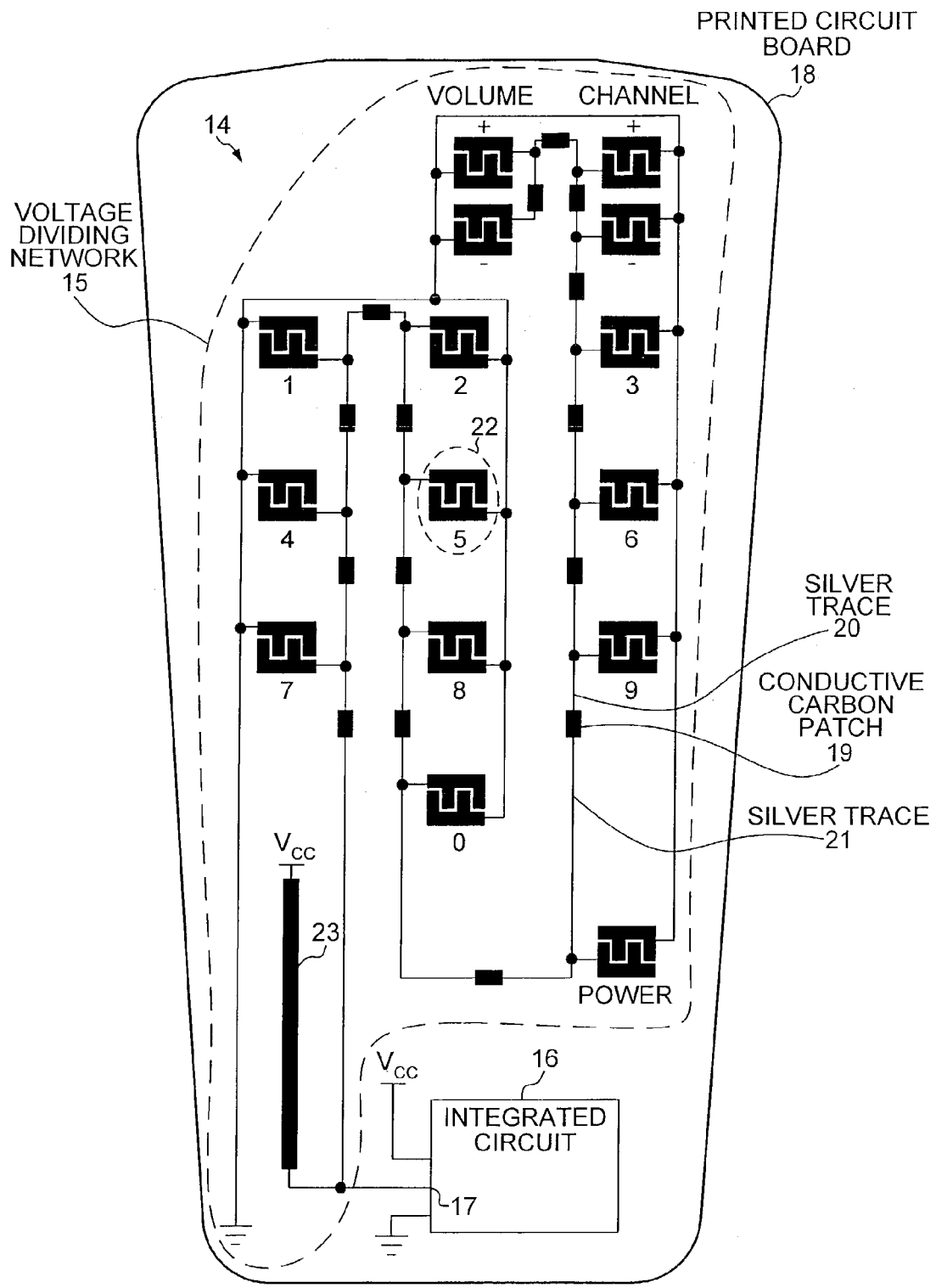
FIG. 3 is a diagram of the printed circuit board within the remote control device of FIG. 2.

FIG. 3 is a schematic diagram of a keypad encoding circuit 14 contained within the remote control device 13 of FIG. 2. Keypad encoding circuit 14 includes a voltage dividing network 15 and an integrated circuit 16. A single input terminal 17 on integrated circuit 16 is used to determine which key on remote control device 13 has been pressed. In this embodiment, keypad encoding circuit 14 is implemented on a single-sided printed circuit board 18. Printed circuit board 18 includes two sets of conductive traces disposed on the same side of the printed circuit board: 1) a set of printed silver traces, and 2) a set of printed conductive carbon traces. By using printed traces (in this example silk-screened traces) as opposed to conventional etched printed circuit board traces, keypad encoding circuit 19 can be manufactured without incurring costs associated with the etching process. Moreover, the printed circuit board 18 need not be rigid. Printed circuit board 18 can be made of a transparent, flexible film.

The conductive carbon traces are made by depositing a carbon powder with a thermal cure resin using a conventional, commercially available silk screening machine. The carbon traces are about 25-30 microns thick when they are deposited onto printed circuit board 18. An example of a brand of conductive carbon dissolved in an organic solvent is Acheson 8120H. After the carbon traces dry and the organic solvent, such as DBE, evaporates, the carbon traces are about 11-22 microns thick. The resistivity of the dried carbon traces is about 15-25 Ohms per square millimeter.

In a first step, the silver traces are printed (in this case silk-screened) onto bare printed circuit board 18. Silver is deposited as a conductive liquid or paint and is allowed to dry. Spaces are left in the silver traces for resistors to be inserted in a second step. Reference numeral 19 in FIG. 3 designates a resistor disposed in a space between silver traces 20 and 21.

Spaces are also left under each key of the keypad for interleaved finger landing pads to be inserted in the second step. Reference numeral 22 represents an interleaved finger landing pad that is located under the five key. Because remote control device 13 has fifteen keys, fifteen spaces are left for fifteen landing pads.

In the second step, conductive carbon is printed (in this case silk-screened) onto the spaces in the silver traces to form resistors. Because the conductive carbon layer that is printed in the second step is less conductive than the silver that is printed in the first step, the conductive carbon patches printed onto the spaces in the silver wires are considered to be resistors.

Figure 1:
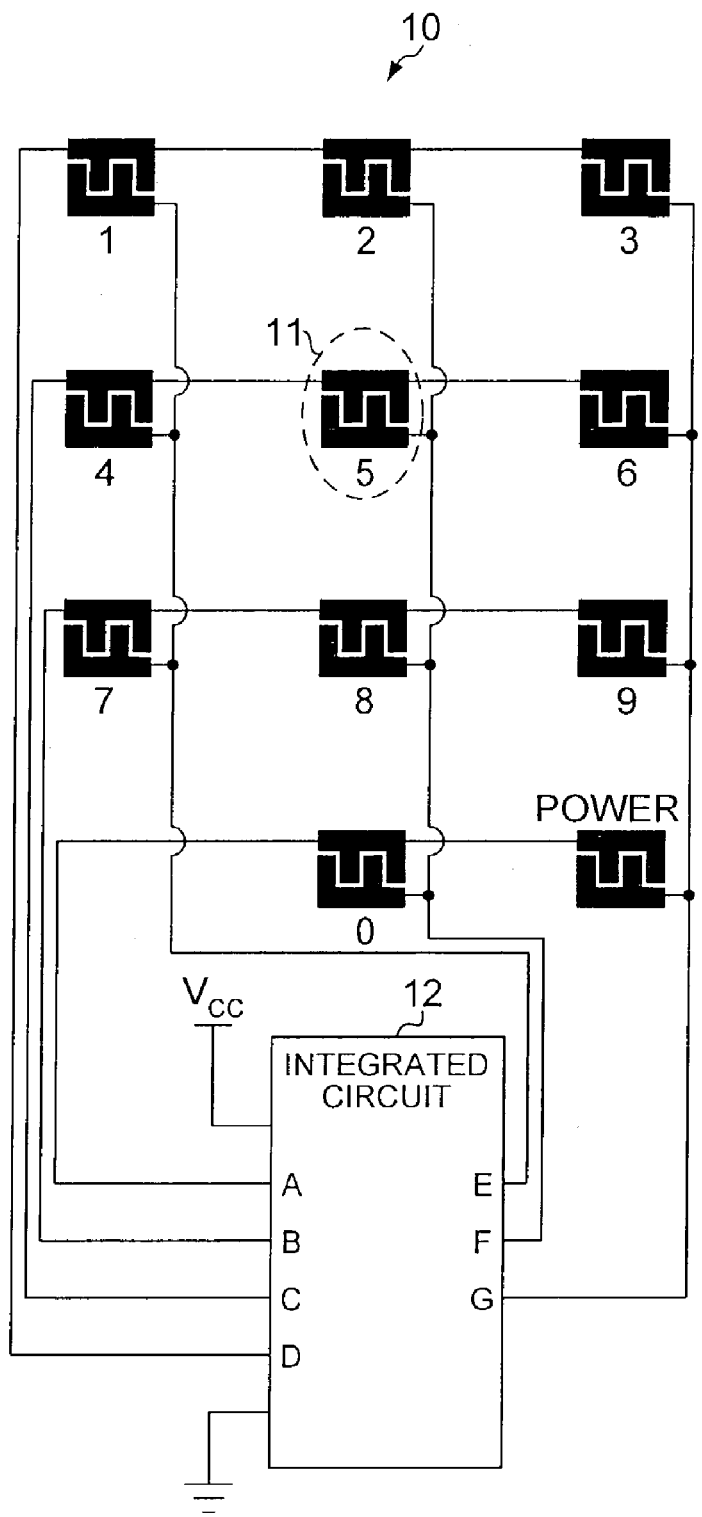
FIG. 1 (prior art) is a diagram of conventional keypad matrix scanning circuit.

In the same second step, conductive carbon is also printed onto the spaces left under each key of the keypad to form landing pads. In operation, rubber keys of the remote control device (see FIG. 1) protrude to the outside surface of remote control device 18. On the inside surface of each key is a conductive carbon pad. When a key is pressed, the conductive carbon pad on the inside surface of the key makes carbon-carbon contact with the two interleaved hands of the landing pad. The pressing of the key therefore couples the two interleaved hands of the landing pad together.

Although conductive carbon is described here as being deposited in the second step into spaces to form the landing pads, this need not be the case. In some embodiments, interleaved finger landing pads of silver are deposited in the first step. Conductive carbon is then printed onto the silver landing pads in the second step such that each interleaved hand of each landing pad includes an underlying layer of silver coated with an overlying layer of conductive carbon.

Where silver interleaved finger landing pads are deposited in the first step, the silver landing pads are coated with conductive carbon to prevent oxidation of the metal landing pads. Without the conductive carbon coating, a poorly-conductive metal oxide layer can build up over time on the surfaces of the two interleaved hands. The metal oxide layer can prevent the formation of a good electrical connection when the corresponding rubber key is pressed.

Of importance, keypad encoding circuit 14 of FIG. 3 has no discrete resistor components that are soldered to the printed circuit board. Rather, the same layer of conductive carbon that is used to form the landing pads is also used to form the resistors of voltage dividing network 15. The resistors are coupled together to form a resistor string, one node of which is coupled to terminal 17 of integrated circuit 16. A longer conductive carbon patch 23 forms a pull-up compensation resistor which is the resistor at the beginning of the resistor string nearest $V_{CC}$. Each of the other nodes of the resistor string is associated with a corresponding key. When the key is pressed, the node associated with the key is coupled to ground.

As shown in FIG. 3, keypad encoding circuit 14 is laid out such that none of the traces overlaps another trace. Therefore, no insulating layer is required to isolate the silver traces formed in the first step from the conductive carbon traces formed in the second step. In an optional step, however, a passivation layer, such as a solder mask, is deposited on the printed circuit board after the silver traces are formed in the first step. This solder mask can be used to facilitate the soldering of surface mount components to the printed circuit board that are not part of keypad encoding circuit 14. Open areas are left in the passivation layer at the spaces in the silver wires, as well as over the landing pads. An open area is also left in the passivation layer for integrated circuit 16. Because integrated circuit 16 has only a few terminals that are spaced relatively far apart in accordance with an embodiment of the invention, a solder mask is not required to solder integrated circuit 16 to printed circuit board 18. Printed circuit board 18 includes no insulating layer and no solder mask layer.

Accordingly, keypad encoding circuit 14 in accordance with an embodiment of the present invention reduces manufacturing cost of a remote control device by: 1) reducing the number of terminals required to detect which key has been pressed, 2) reducing the size of the integrated circuit package, 3) reducing the die area, 4) reducing the number of bonding pads on the die, 5) utilizing no discrete resistors, 6) utilizing only printed layers of traces, 7) utilizing no insulating layer to isolate traces from one another, and 8) utilizing no solder mask layer.

Figure 4:
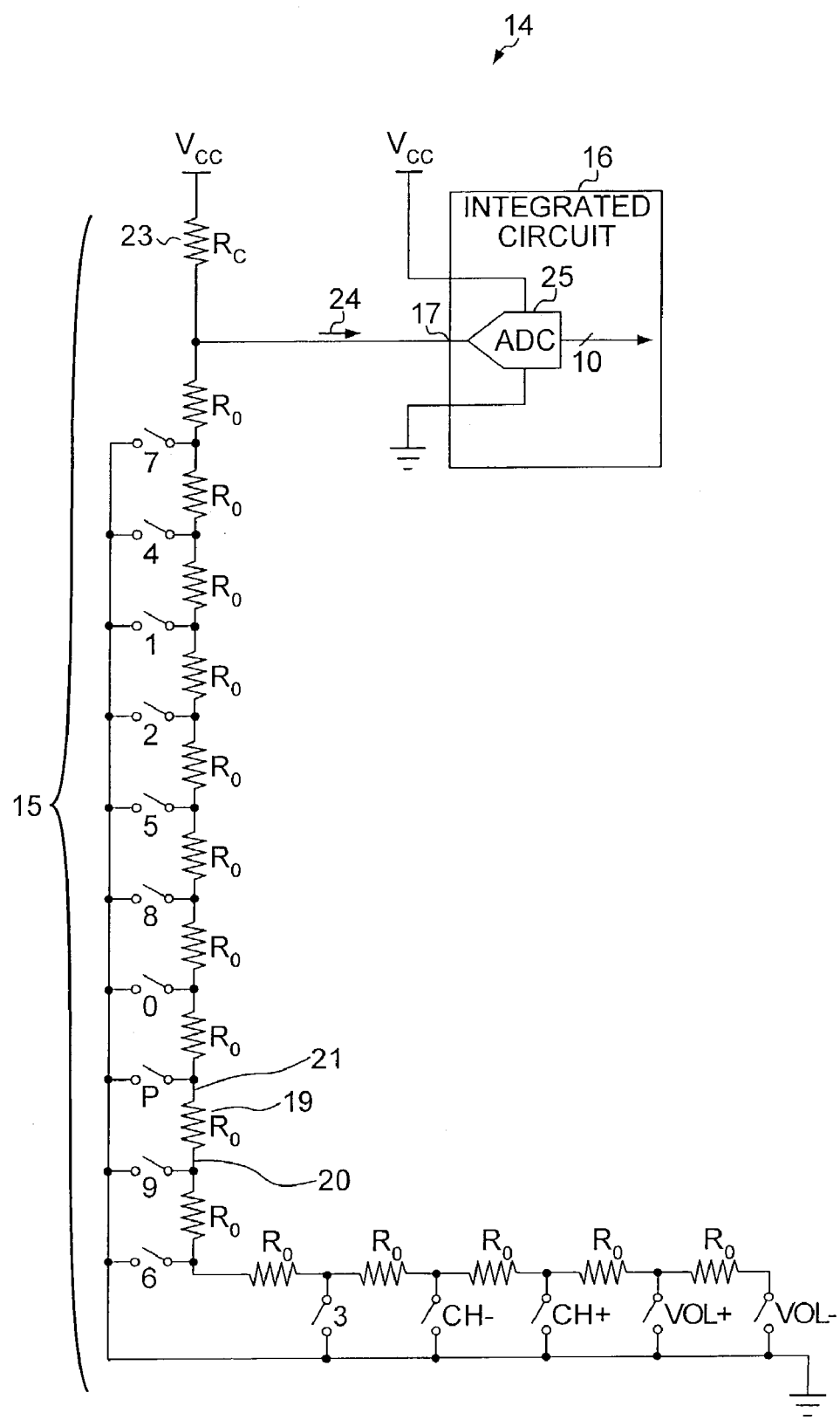
FIG. 4 is a schematic diagram of the circuitry on the printed circuit board of FIG. 3.

FIG. 4 is a circuit diagram that is illustrative of how the keypad encoding circuit 14 of FIG. 3 operates. Integrated circuit 16 receives an encoding signal voltage 24 on terminal 17 from voltage dividing network 15. As illustrated, each key is associated with a node in the resistor string of the voltage dividing network 15. When a key is pressed, the node corresponding to the key is coupled to ground. The encoding signal voltage 24 output by the voltage dividing network 15 is proportional to the ratio of the resistance of the $R_C$ compensation resistor 23 to the sum of the resistances of the series-connected resistors $R_0$ between terminal 17 and the key that is pressed. An analog-to-digital converter (ADC) 25 within integrated circuit 16 uses a single terminal 17 to receive encoding signal voltage 24 and converts it into a ten-bit digital value that corresponds to the key that has been pressed. In this embodiment, a unique 10-bit digital value corresponds to each key.

Figure 5:
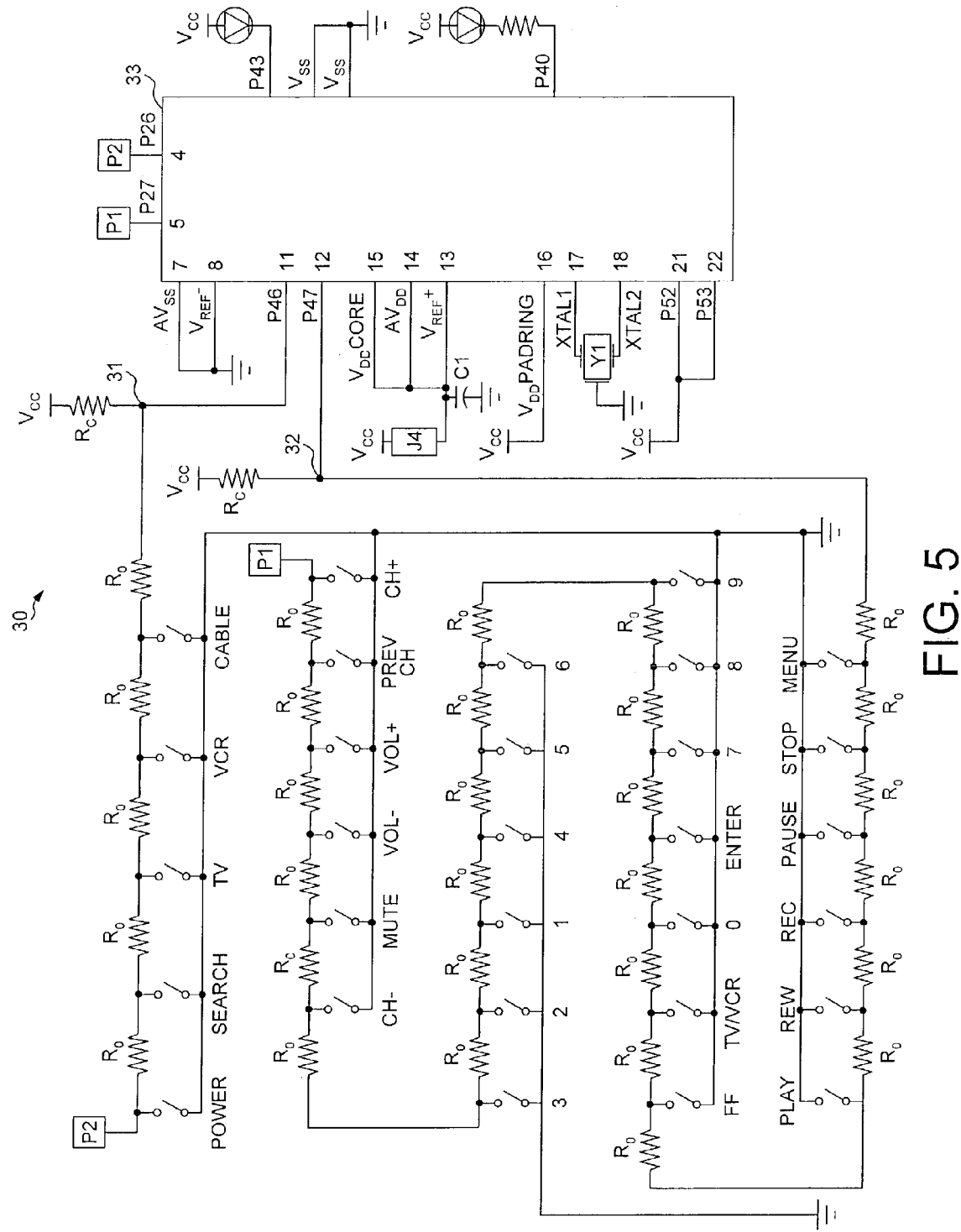
FIG. 5 is a diagram in accordance with another embodiment of the present invention.

FIG. 5 is a circuit diagram of another embodiment of a keypad encoding circuit wherein resistors are formed from conductive carbon patches. Keypad encoding circuit 30 contains two voltage dividing networks to encode the keys of a remote control device having thirty keys. An encoding signal voltage present on node 31 is indicative of one of the five keys on the first voltage dividing network that has been pressed. An encoding signal voltage present on node 32 is indicative of one of the twenty-five keys on the second voltage dividing network that has been pressed. Integrated circuit 33 receives encoding signal voltages on terminals 11 and 12.

Figure 6:
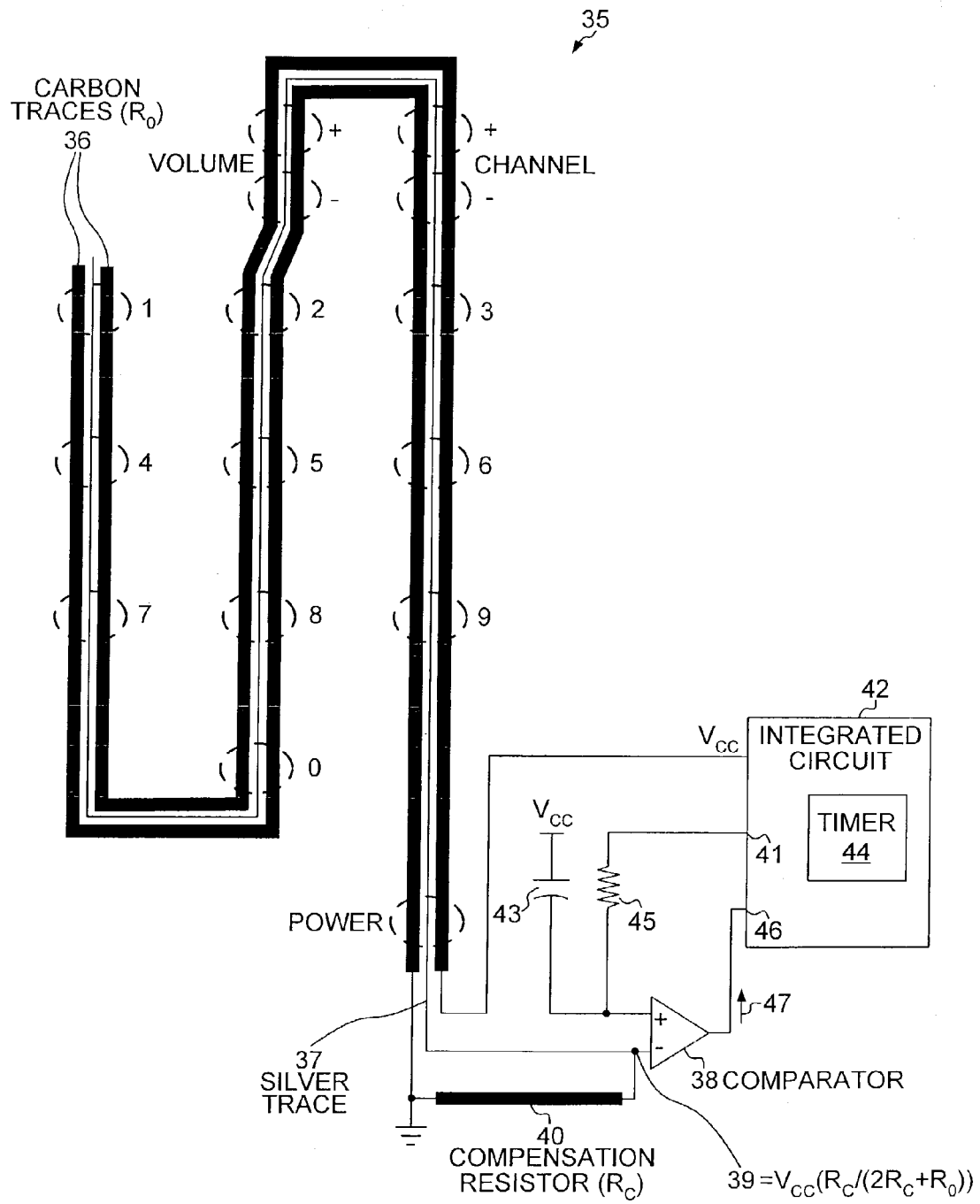
FIG. 6 is a diagram of a keypad encoding circuit in accordance with another embodiment of the present invention.

FIG. 6 shows yet another embodiment of a keypad encoding circuit 35 in accordance with an embodiment of the present invention. Keypad encoding circuit 35 does not use patches of conductive carbon that are deposited in spaces between silver traces. Instead, two parallel carbon traces 36 extend under each of the keys of the keypad. The parallel carbon traces 36 themselves serve as landing pads for the conductive carbon pad on the inside surface of each key. The dashed ovals in FIG. 6 represent the areas on the parallel carbon traces that serve as the landing pads for the various keys of the keypad.

The parallel carbon traces of keypad encoding circuit 35 can be manufactured using a less-precise printing process (for example, silk screening process) than the one used to deposit the conductive carbon landing pads of keypad encoding circuit 14 in FIG. 3 because no interleaved finger landing pads are used in keypad encoding circuit 35. A thinner silver trace 37 runs between the parallel carbon traces 36. This silver trace 37 is coupled to the inverting input lead of comparator 38.

When a key is pressed, the conductive carbon pad on the inside of the key contacts the silver trace 37 as well as the two carbon traces 36. The conductive carbon pad on the inside of the key therefore shorts the three traces together at the location of the key. As can be seen in FIG. 6, when a key is pressed the length of both carbon traces 36 through which current passes is the same, although the length depends upon which key is pressed. Therefore, the resistance $R_0$ of the two carbon traces 36 through which current passes is the same. The magnitude of resistance $R_0$, however, depends upon which key is pressed. Because the magnitude of resistance $R_0$ of the portions of both carbon traces 36 through which current passes is the same, the encoding signal voltage 39 equals $V_{CC}(R_C/(2R_C+R_0))$ where $R_C$ is the resistance of compensation resistor 40. Compensation resistor 40 is manufactured with the same printing (for example, silk screening) process as are the parallel carbon traces 36. Silver trace 37 communicates the encoding signal voltage 39 from the location of the key that is pressed to the inverting input lead of comparator 38.

The voltage on the non-inverting input lead of comparator 38 is initialized to supply voltage $V_{CC}$ by setting the voltage on terminal 41 of integrated circuit 42 to $V_{CC}$. Once capacitor 43 is discharged and the voltage on the non-inverting input lead of comparator 38 is initialized to $V_{CC}$, then terminal 41 is set to ground, thereby sinking current to ground potential. A timer 44 within integrated circuit 42 is started counting from zero.

The voltage on the non-inverting input lead of comparator 38 then decays to ground potential at a rate dependent on the RC time constant of capacitor 43 and resistor 45. Comparator 38 outputs a digital encoding signal 47 that is a digital value indicating which key has been pressed based on the period of time that elapses before the digital value toggles. The digital value is governed by the period of time required for the voltage on the non-inverting lead of comparator 38 to decay to the voltage on the inverting lead of comparator 38. Upon the elapse of the time period, terminal 46 of integrated circuit 42 detects that the output of comparator 38 has switched from a digital logic "1" to a digital logic "0". The value of the time period measured by timer 44 is indicative of which key was pressed.

Although resistor 45, capacitor 43 and comparator 38 are illustrated in FIG. 6 as being external to integrated circuit 42, they are in some embodiments integrated into integrated circuit 42. By incorporating these components onto integrated circuit 42, the number of discrete components in the circuit is reduced.

Figure 7:
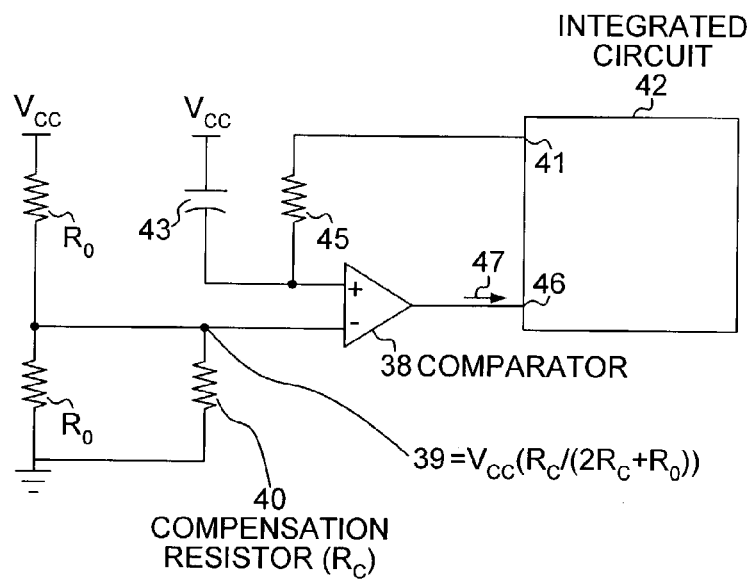
FIG. 7 is a schematic diagram of circuitry that is equivalent to the keypad encoding circuit of FIG. 6.

FIG. 7 is a simplified circuit diagram that is equivalent to the keypad encoding circuit 35 shown in FIG. 6.

Figures 8A, 8B:
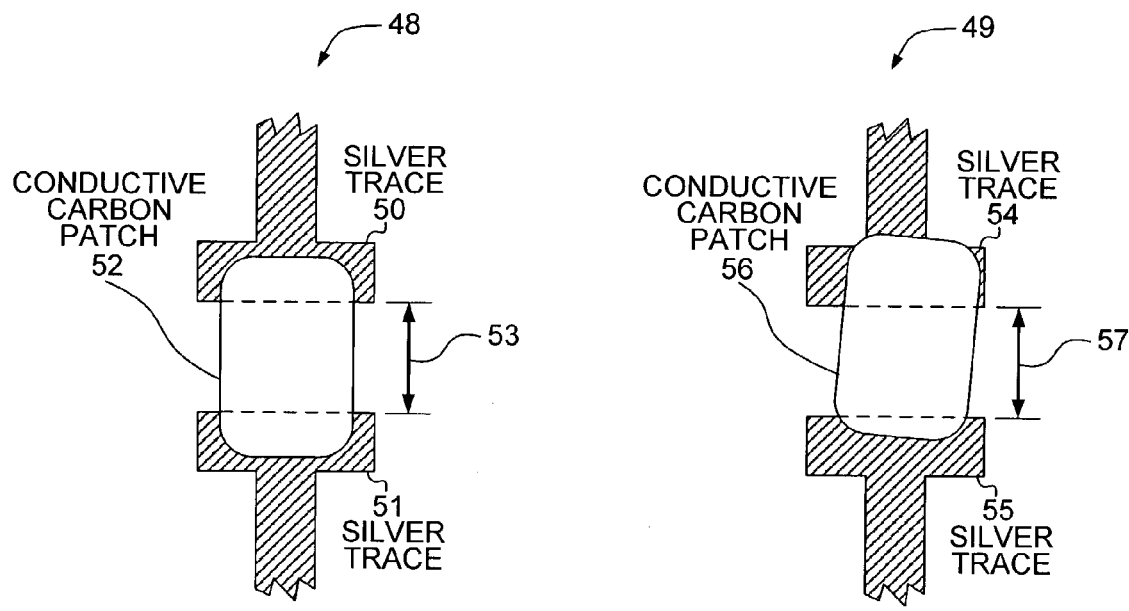
FIGS. 8A and 8B are diagrams of resistor structures formed with conductive carbon patches in yet other embodiments of the present invention.

FIGS. 8A and 8B are diagrams of two resistor structures 48 and 49 of a resistor string in accordance with another embodiment. FIG. 8A shows ends of two collinear silver traces 50 and 51 of first resistor structure 48 on a printed circuit board. Traces 50 and 51 have T-shaped ends. A patch of conductive carbon 52 is disposed over and extends over each of the ends of traces 50 and 51. The resistance of the resistor formed by conductive carbon patch 52 depends on the amount of conductive carbon through which current flows. Because the distance 53 between the two ends of the traces can be tightly controlled, so too can the amount of the conductive carbon through which current flows. The resistance of resistor structure 48 formed by conductive carbon patch 52 is not dependent on the length of the conductive carbon patch 52. Moreover, the resistance of resistor structure 48 is not dependent on the alignment or orientation of conductive carbon patch 52.

FIG. 8B shows second resistor structure 49 in which conductive carbon patch 56 is somewhat out of alignment compared to conductive carbon patch 52. The distance 57 between the ends of traces 54 and 55, however, is substantially the same as the distance 53. The resistance of second resistor structure 49 is, therefore, substantially the same as the resistance of first resistor structure 48. The resistance of resistor structures having substantially similar distances between their T-shaped ends is therefore relatively repeatable even though the dimensions and alignment of the conductive carbon patches may vary.

The collinear traces in FIGS. 8A and 8B are formed by depositing a conductive silver liquid in a silk-screening process. In another embodiment of the resistor structures of the resistor string, the traces are formed by conventional etching on a printed circuit board. Such etched traces may, for example, be copper etched traces. The distance between the two ends of the etched traces can be more tightly controlled, so that the resistance of resistor structures is more easily repeatable with etched traces.

Although the present invention has been described in connection with embodiments that use conductive carbon to form a resistor string, the resistor string can alternatively be made of other materials that have resistances differing from the absolute resistance of conductive carbon.

Although the keypad encoding circuit of the present invention is described above in connection with remote devices having a relatively small number of keys, it is to be understood that the keypad encoding circuit is usable in devices having a larger number of keys. Where an infrared transmitting remote control device controls multiple electronic appliances, such as a television, a video cassette recorder (VCR), a digital video disk (DVD) player and a stereo player, the keypad may have thirty keys or more. The keypad encoding circuit is usable in such a remote device. Although the keypad encoding circuit is described above in connection with remote control devices such as infrared transmitting remote control devices usable to control electronic appliances, the keypad encoding circuit is usable in numerous other types of devices having keys from small keypad devices to large devices having a large number of keys such as, for example, the keyboard of a personal computer.

Although the present invention has been described in connection with certain specific embodiments for instructional purposes, the present invention is not limited thereto. In another embodiment, for example, a keypad encoding circuit is implemented with two sets of conductive traces. The traces are not silver traces and conductive carbon traces, but rather are traces of an etched first metal, such as copper, and silk-screened traces of another metal that is less conductive than the first metal. The inexpensive deposited traces need not be deposited by silk-screening or printing processes. The inexpensive deposited traces can, for example, be spray painted onto the circuit board. In accordance with one specific embodiment, a keypad encoding circuit is implemented with only one set of conductive traces. Silver paste or paint forms all of traces that are formed with conductive carbon and with silver in the aforementioned embodiments.

Accordingly, various modifications, adaptations, and combinations of various features of the described embodiments can be practiced without departing from the scope of the invention as set forth in the claims.

What is claimed is:

1. An encoding circuit for determining which of a plurality of keys has been pressed, the encoding circuit comprising:
    an integrated circuit having a terminal; and
    a voltage dividing network that generates an encoding signal voltage indicative of which of the plurality of keys has been pressed, the encoding signal voltage being supplied to the terminal of the integrated circuit, the voltage dividing network comprising a substrate, a deposited conductive layer of a resistive material deposited on the substrate forming both a string of resistors and a plurality of landing pads wherein the deposited resistive layer does not cross any other layer of the voltage dividing network, and a conductive layer deposited on the substrate interconnecting elements of the resistive layer.

2. The encoding circuit of claim 1, wherein the plurality of keys is part of a single flexible nonconductive member, each of the keys having a conductive carbon surface, the conductive carbon surface of a key making contact with an associated one of the landing pads when the key is pressed.

3. The encoding circuit of claim 1, wherein the conductive layer is a plurality of silver traces.

4. The encoding circuit of claim 1, wherein the string of resistors comprises a compensation resistor and a plurality of resistors, each resistor of the plurality of resistors being associated with a corresponding one of the plurality of keys.

5. The encoding circuit of claim 1, wherein the substrate is a printed circuit board, the conductive layer forming a plurality of traces, the conductive layer being a metal layer.

6. The encoding circuit of claim 5, wherein the metal layer is an etched layer of the printed circuit board.

7. The encoding circuit of claim 5, wherein the metal layer is a printed layer that is deposited onto the printed circuit board.

8. The encoding circuit of claim 5, wherein the resistive material is non-oxidizing and comprises carbon.

9. The encoding circuit of claim 5, wherein the printed circuit board is a transparent, flexible film.

10. The encoding circuit of claim 5, wherein the encoding circuit is part of a remote control device for an electronic appliance.

11. The encoding circuit of claim 5, wherein there is no etched metal layer disposed on the printed circuit board.

12. The encoding circuit of claim 5, wherein there is a single etched metal layer disposed on the printed circuit board, the plurality of traces being formed of the single etched metal layer.

13. The encoding circuit of claim 1, wherein the terminal is the only terminal of the integrated circuit that receives a signal indicative of which of the plurality of keys has been pressed.

14. The encoding circuit of claim 1, wherein the integrated circuit comprises an analog-to-digital converter, the analog-to-digital converter converting the encoding signal voltage from an analog value into a multi-bit digital value.

15. The encoding circuit of claim 1, wherein the voltage dividing network is coupled to a comparator, the comparator outputting the encoding signal voltage, the encoding signal voltage being a one-bit digital value.

16. The encoding circuit of claim 15, wherein the comparator receives a voltage that decays depending on an RC time constant.

17. The encoding circuit of claim 1, wherein the integrated circuit comprises a die and a package.

18. The encoding circuit of claim 1, wherein the integrated circuit consists of a die.

19. An encoding circuit for determining which of a plurality of keys has been pressed, the encoding circuit comprising:
   an integrated circuit having a plurality of terminals; and
   means for generating an encoding signal indicative of which of the plurality of keys has been pressed, the encoding signal being supplied to a single terminal of the integrated circuit, wherein the means comprises a resistive layer and a conducive layer both deposited on a printed circuit board, wherein the resistive layer forms both resistors and a plurality of landing pads and the conductive layer interconnects elements of the resistive layer, and wherein the neither the resistive layer nor the conductive layer overlaps another conductive layer.

20. The encoding circuit of claim 19, wherein the resistors are formed from trances of the resistive layer.

21. The encoding circuit of claim 19, wherein the encoding circuit is part of a keyboard of a personal computer.

22. The encoding circuit of claim 19, wherein there is no solder mask layer disposed on the printed circuit board.

23. The encoding circuit of claim 19, wherein there is no insulating layer disposed on the printed circuit board.

24. The encoding circuit of claim 5, wherein there is no solder mask layer disposed on the printed circuit board.

25. The encoding circuit of claim 5, wherein there is no insulating layer disposed on the printed circuit board.

\* \* \* \* \*

UNITED STATES PATENT AND TRADEMARK OFFICE
CERTIFICATE OF CORRECTION

PATENT NO. : 7,391,342 B1  Page 1 of 1
APPLICATION NO. : 10/359405
DATED : June 24, 2008
INVENTOR(S) : Daniel SauFu Mui It is certified that error appears in the above-identified patent and that said Letters Patent is hereby corrected as shown below:

Column 10, line 22, the word "trances" should be changed to --traces--.

The text of column 10, lines 21-22, should now read:

20. The encoding circuit of claim 19, wherein the resistors are formed from traces of the resistive layer.

Signed and Sealed this

Eighth Day of June, 2010

David J. Kappos
*Director of the United States Patent and Trademark Office*